(12) United States Patent
Dettloff et al.

(10) Patent No.: US 8,618,869 B2
(45) Date of Patent: Dec. 31, 2013

(54) FAST POWER-ON BIAS CIRCUIT

(75) Inventors: Wayne Dettloff, Cary, NC (US); John Wilson, Raleigh, NC (US); Lei Luo, Durham, NC (US); Brian Leibowitz, San Francisco, CA (US); Jared Zerbe, Woodside, CA (US); Pravin Kumar Venkatesan, Bangalore (IN)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 13/341,483

(22) Filed: Dec. 30, 2011

(65) Prior Publication Data

US 2012/0169412 A1    Jul. 5, 2012

Related U.S. Application Data

(60) Provisional application No. 61/428,616, filed on Dec. 30, 2010, provisional application No. 61/561,385, filed on Nov. 18, 2011.

(51) Int. Cl.
*G05F 1/10*    (2006.01)

(52) U.S. Cl.
USPC ............................ 327/538; 323/316

(58) Field of Classification Search
USPC ................... 327/538; 323/315–317
See application file for complete search history.

(56) References Cited

U.S. PATENT DOCUMENTS

| | | | | |
|---|---|---|---|---|
| 5,506,521 | A * | 4/1996 | Collins | 326/126 |
| 6,201,380 | B1 * | 3/2001 | Tsujino et al. | 323/313 |
| 6,285,223 | B1 * | 9/2001 | Smith | 327/143 |
| 6,535,424 | B2 | 3/2003 | Le et al. | 365/185.18 |
| 6,909,264 | B2 * | 6/2005 | Del Gatto et al. | 323/268 |
| 7,102,419 | B2 * | 9/2006 | Lou et al. | 327/530 |
| 7,763,991 | B2 * | 7/2010 | Ogiwara et al. | 307/43 |
| 7,944,381 | B2 * | 5/2011 | Kuttner | 341/136 |
| 8,049,551 | B2 * | 11/2011 | Kotowski et al. | 327/536 |
| 8,274,416 | B2 * | 9/2012 | Kawaguchi et al. | 341/144 |
| 8,324,957 | B2 * | 12/2012 | Thomas et al. | 327/375 |
| 2007/0001747 | A1 * | 1/2007 | von Kaenel | 327/538 |
| 2012/0007660 | A1 * | 1/2012 | Hummerston et al. | 327/530 |

* cited by examiner

*Primary Examiner* — Thomas J Hiltunen
(74) *Attorney, Agent, or Firm* — Hamilton, Brook, Smith & Reynolds, P.C.

(57) ABSTRACT

Conventional bias circuits exhibit a number of limitations, including the time required to power-up a bias circuit following a low-power state. Large current surges in the supply network induce ringing, further complicating a power-up process. Example embodiments reduce power-up time and minimize current surges in the supply by selectively charging and discharging capacitance to the circuit during power-up and power-down of the bias circuit.

29 Claims, 10 Drawing Sheets

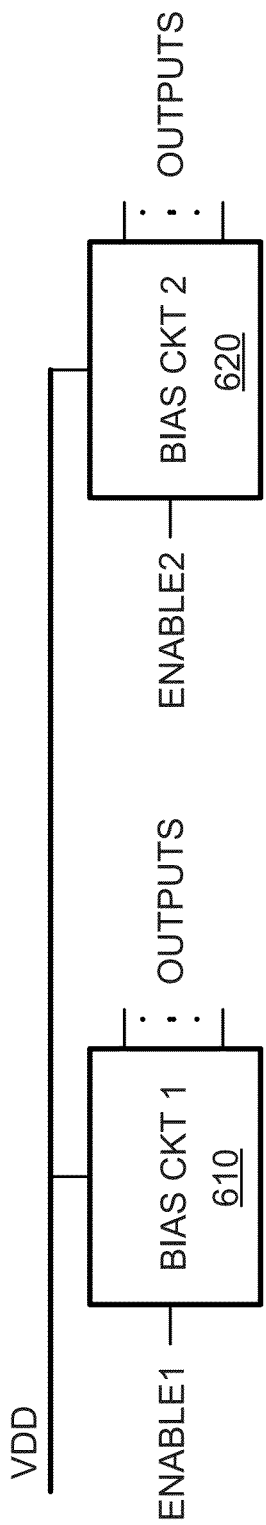
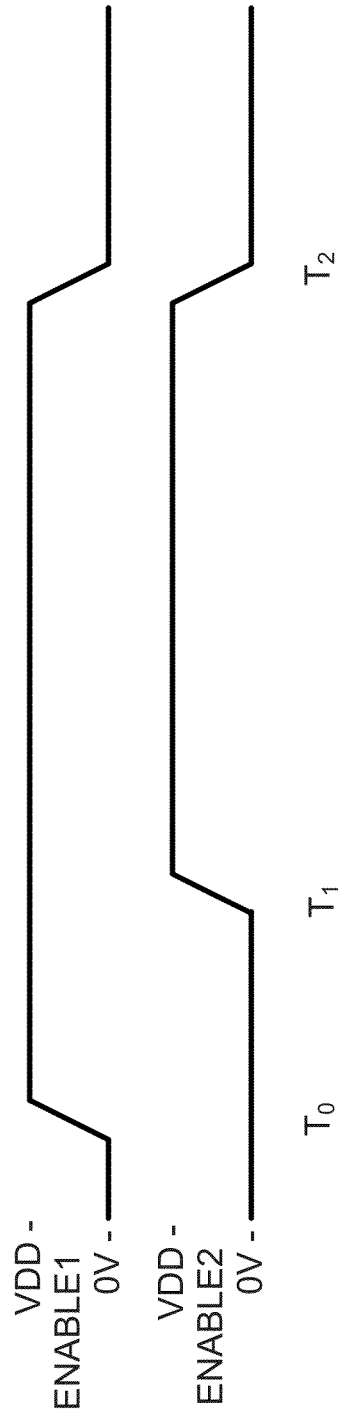
FIG. 6A
FIG. 6B

FAST POWER-ON BIAS CIRCUIT

RELATED APPLICATION(S)

This application claims the benefit of U.S. Provisional Application No. 61/428,616, filed on Dec. 30, 2010, and U.S. Provisional Application No. 61/561,385, filed on Nov. 18, 2011. The entire teachings of the above applications are incorporated herein by reference.

BACKGROUND

Bias circuits are widely employed in analog or mixed signal electronic circuitry to set operating conditions by establishing a predetermined voltage at a given node. Typically, maintaining a bias node at a desired voltage consumes power. Therefore, bias circuits are often disabled in low-power or power-down operating states. A bias circuit may also require a length of time to generate a steady state voltage at the bias node, and the length of time may be related to power consumption and noise filtering.

On-chip regulators represent a specific class of bias circuits that typically are used to generate a non-rail supply voltage for other circuits. Regulators generally provide power and are heavily bypassed, exacerbating the maintenance power issue as well as the length of time required to reach steady state.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating the example embodiments.

FIG. 6A is a block diagram of a plurality of bias circuits

FIG. 6B is a timing diagram of a staggered startup of a plurality of bias circuits.

DETAILED DESCRIPTION

A description of example embodiments follows.

Conventional bias circuits exhibit a number of limitations. As low power operation of electronic circuits becomes increasingly important, the capability to enter the lowest power state whenever possible becomes essential. Conventionally, bringing the bias circuits back online is a major limitation of quickly returning to an operational power state. This is often due to the fact that, in order to minimize any possible noise injection, bias nodes are often heavily bypassed to a supply rail. Additionally, large current surges in the supply network will likely induce ringing, further complicating a power-up of the circuit.

Power is consumed maintaining a steady-state voltage on a node that is not equal to a supply rail. For example, if the power supply is 1.2V and the ground return is 0V, then at least some on-chip power is consumed in the process of generating a non-rail voltage, such as 0.5V. Therefore, in the lowest power consumption mode (a "power-down" mode), a non-rail voltage is not maintained, and all nodes may be either pulled up to 1.2V or down to 0V.

Generally, during power-up of a circuit, greater power is consumed to obtain a non-rail voltage in less time. For example, a circuit may be configured to obtain the desired non-rail voltage ("operating point") in minimal time, but may also consume excessive power during normal operation and cause a supply collapse by requiring a large current surge during the power-up. Further, in order to keep noise immunity, additional bypass capacitance may be placed from a bias line to a supply rail, further slowing down the activation of the bias line. Thus, to conserve operating power and maintain integrity of the supply, typical circuits generating non-rail voltages exhibit a relatively slow power-on process.

Further, typical bias circuits exhibit substantial capacitance at the supply node. Due to the inductance of the supply line and on-chip capacitance to reduce noise between the supply rails, any change in current to the bias circuit will induce a ringing in the supply voltage. The "severity" of the ringing will be dependent upon the magnitude of the current change, the speed of the surge, the value of the inductance and effective capacitance, and other factors.

In view of the characteristics of bias circuits and, more generally, circuitry for maintaining a non-rail voltage, example embodiments described below provide optimized non-rail voltages while improving the start-up speed and without inducing a large supply current surge.

Figure 1A:
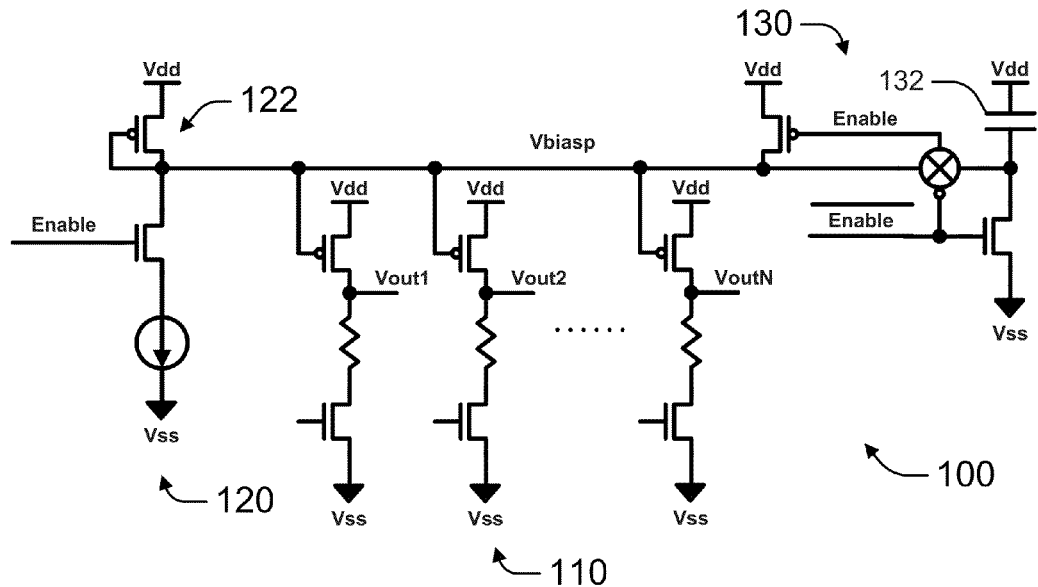
FIG. 1A is a circuit diagram of a bias circuit implementing one embodiment.

FIG. 1A is a circuit diagram of a bias circuit 100 according to one embodiment. The bias circuit 100 includes a current source 120 that is selectively enabled by the "Enable" signal to generate, along with a diode connected PMOS device 122, a voltage at the bias voltage node Vbiasp. A plurality of outputs 110, enabled by the bias voltage node Vbiasp, mirror a current at the current source 120. The output nodes Vout1, Vout2 and VoutN may be coupled to one or more nodes of a circuit (not shown) associated with the bias circuit 100. A control circuit 130 selectively couples a capacitor 132 to the network.

Under normal operating conditions (Enable="1"), the bias node Vbiasp is at a voltage between the supply rails Vdd, Vss. During power down (Enable="0"), Vbiasp is pulled to Vdd, which in turn disables the outputs 110 (Vout1, Vout2, VoutN). The current source 120 may also be turned off to complete a power down of the circuit. The "power on" time, being the time required for the node Vbiasp to transition from Vdd to the given operating voltage, is dependent upon the total capacitance at the node and the value of the current source 120 as well as the characteristics of the diode connected PMOS device 122. The "power on" time can be decreased by increasing operating power or the current at the current source 120 when the bias circuit 100 is initially powered on.

The control circuit 130 selectively couples the capacitor 132 to the network according to the "Enable" signal. In this manner, the capacitor 132 has zero volts on the lower terminal during power down, and, during power-up, is coupled to the bias node Vbiasp. Thus, upon startup, the charge on Vbiasp moves onto the capacitor 132, thus bringing the voltage at the bias node Vbiasp toward the operating point voltage. As a result, the operating voltage can be obtained quickly, with minimal impact upon normal operation, while simultaneously reducing a surge of supply current to the bias circuit 100.

In order to configure the control circuit 130 and capacitor 132 to achieve the operating voltage, the value of operating voltage for the bias node Vbiasp is first obtained. The total capacitance C for the node, including any residual capacitance exhibited by the circuit components, is obtained by measurement or estimation. The total capacitance C may then be divided into two domains in the power-down state: a first portion of C may be pulled to Vdd during power-down, while a second portion is pulled to Vss during power down. The domains are separated in the power-down state by the control circuit 130, which isolates them via a passgate structure. The domains may be configured to be proportional to the desired operating voltage, such that, when the domains are combined upon startup of the circuit 100 (the control circuit 130 enables the path at Vbiasp), a voltage approximating or matching the operating voltage appears at the bias node Vbiasp.

A "charge share" may be effected between the capacitor 132 and the capacitance at the bias node Vbiasp opposite the control circuit 130. Given two identical capacitors, if the first capacitor is charged to 1.2V, the second is completely discharged (to 0V), and the two are shorted together via a switch, the resultant voltage will be 0.6V, or halfway between the two capacitors' initial voltages. The charge on the first capacitor is "shared" to the second and since they are identical, the initial charge gets split equally. If the first capacitor is twice as large as the second, then the resultant voltage will be ⅔ of the initial voltage or 0.8V. Similarly, if the second is three times as large as the first, the final voltage will be ¼ of the 1.2V or 0.3V. By adjusting the ratio of capacitance, one can obtain a desired non-rail voltage.

Thus, with respect to the capacitor 132, the capacitance value of the capacitor 132 may be selected based on the proportional capacitance to be achieved as described above. In particular, the capacitor 132 may be configured as a portion of the total capacitance C that is pulled to Vdd during power down. When the Enable signal is asserted to initiate power-up of the bias circuit 100, the two domains combine ("charge share") to produce the desired operating voltage at Vbiasp.

During power-down, all nodes are pulled to supplies and hence only consume current from device leakage, which may be quite low. Other supply voltages, if available, may also be employed to optimize start-up time, current surge reduction, silicon area or other design considerations. The additional circuitry can be implemented in parallel to the existing bias circuitry. It may be beneficial to add additional capacitance to the bias node Vbiasp to achieve the target proportion of capacitance at the two domains. For example, a circuit implementation may present obstacles to dividing a node between the two domains during power-down, necessitating the additional capacitance.

Further, the bias node Vbiasp may benefit from additional capacitance to increase noise immunity. By referencing both domains of the total capacitance C to either supply (Vdd, Vss), operational noise within the circuit 100 may be minimized. However, the circuit 100 may be configured to "charge share" at power-up as described above, and then disconnect some or all of the capacitance (e.g. capacitor 132) after a specified time or when the desired operating voltage is obtained.

For those cases where the desired operating point is a substantial portion of the supply, a single capacitor as shown may be sufficient to obtain (or approximate) the operating point within an acceptable time. When the operating point requires greater accuracy, or is dependent on characteristics of the circuit a number of alternative configurations to the bias circuit may be implemented. For example, an initial sharing may be conducted as described above, followed by a period of normal circuit operation to pull in the exact value. In this period the active circuitry consisting of the diode-configured PMOS device 122 and the current source 120 pull the bias node Vbiasp to the precise final value. Alternatively, an auto-adjust circuit may be employed to switch in more or less capacitance to compensate, in real time, for a change from the initial conditions. For example, just before a power-up sequence, the amount of capacitance may be adjusted in response to observation of the supply voltage, temperature, or some other circuit or environmental condition as well as the desired bias voltage. Further, a circuit may be implemented perform a calibration that effectively measures change at the bias node and then adjusts the capacitance for the next power-up sequence. Example embodiments employing such configurations are described below with reference to FIGS. 2A, 2B, 3, 4A and 4B.

Because the operating voltage and/or the capacitance of a bias node (e.g., bias node Vbiasp) may be dependent on manufacturing variations, or variations due to operating voltage or temperature, it may not be possible, during initial design of a bias circuit, to configure the capacitances of each domain to effect a "charge share" to obtain an exact voltage at power-on of the bias circuit. In such a case, a capacitance ratio can be selected to minimize startup time across corners. Alternatively, an additional bias circuit (not shown) omitting a control circuit may be employed in conjunction with the bias circuit 100, where the bias circuit 100 obtains an approximate of the operating point and the additional bias circuit transitions to the operating point with greater accuracy. In still further embodiments, a bias circuit may employ a programmable capacitance ratio, which may be adjusted automatically based on a comparison with a replica circuit, or may be adjusted periodically under settings maintained at a register. Examples of such embodiments are described below with reference to FIGS. 2A, 2B and 3. Adjustable bias circuits may be configured to compensate for changes in capacitance or other circuit characteristics resulting from the fabrication process, supply voltage or temperature of the bias circuit.

Figure 1B:
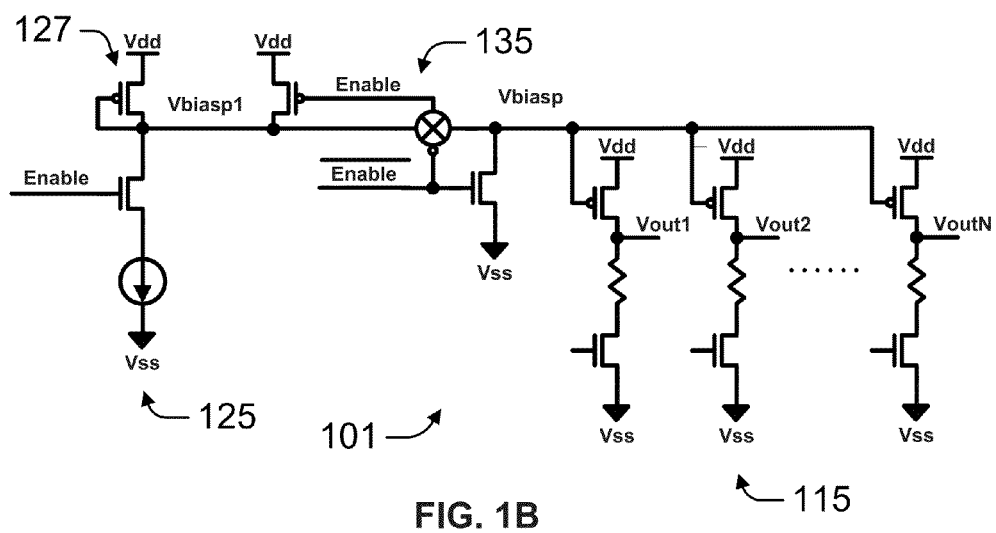
FIG. 1B is a circuit diagram of a bias circuit implementing a further embodiment.

FIG. 1B is a circuit diagram of a bias circuit 101 comparable to the circuit 100 described above, in an alternative configuration. The circuit 101 includes a current source 125 that is selectively enabled by the "Enable" signal to generate, along with a diode connected PMOS device 127, a voltage at the bias voltage node Vbiasp. A plurality of outputs 115, enabled by the bias voltage node Vbiasp, generate output voltages at nodes Vout1, Vout2 and VoutN. The output voltages may be coupled to one or more nodes of a circuit (not shown) associated with the bias circuit 101. A control circuit 135, responsive to the "Enable" signal, selectively couples the two nodes Vbiasp1 and Vbiasp.

The bias circuit 101 may be configured to operate in a manner comparable to the bias circuit 100 described above with reference to FIG. 1A, with the exception that a discrete capacitor is omitted. Rather, the control circuit 135 selectively combines the capacitances inherent at each node Vbiasp1, Vbiasp during power-on of the circuit 101 to obtain the operating point at the bias node Vbiasp. To accomplish this, the control circuit 135 may be positioned within the circuit 101 so as to divide the bias node Vbiasp into the two nodes Vbiasp1, Vbiasp when the control circuit 135 is disabled. The position of the control circuit 135 may be selected so as to achieve a proportional capacitance between the nodes Vbiasp1, Vbiasp as a function of the desired operating point voltage.

When the bias circuit 101 enters a power-down mode, the control circuit 135 pulls the node Vbiasp1 to Vdd, and pulls the node Vbiasp to Vss. Upon power-up of the circuit 101, the control circuit 135 combines the nodes Vbiasp1, Vbiasp to form the desired voltage at Vbiasp, and a "charge share" is effected between the capacitances of the nodes Vbiasp1, Vbiasp. As a result of these capacitances being proportional as described above, the bias node Vbiasp is brought to the operating point quickly following power-up of the bias circuit 101.

Figure 2A:
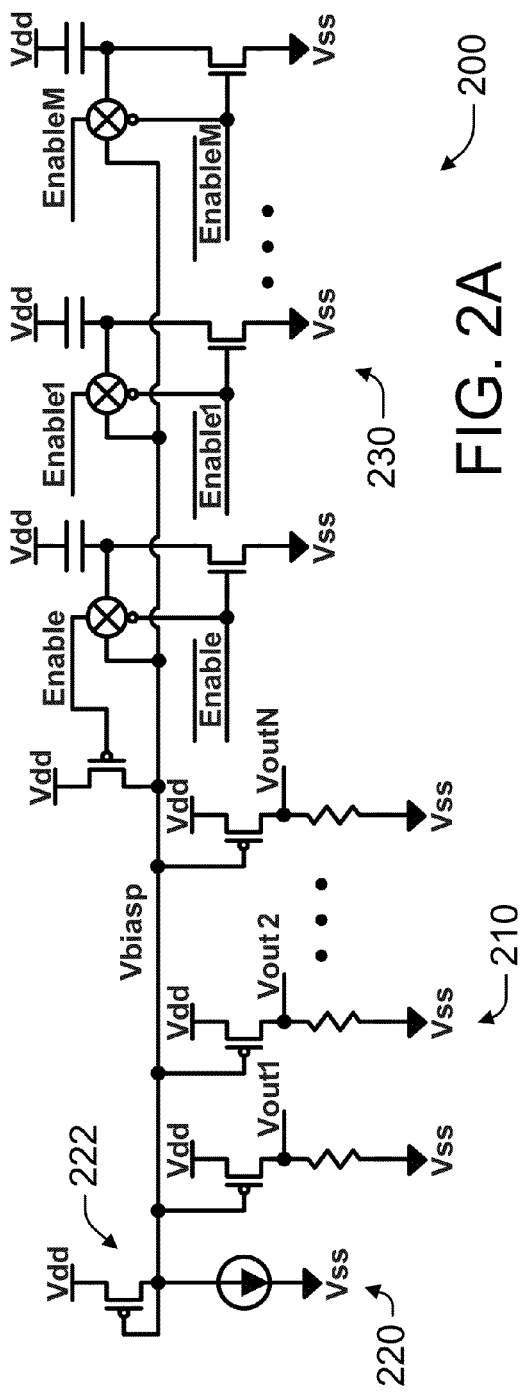
FIG. 2A is a circuit diagram of a bias circuit having a selectable array of capacitors.

FIG. 2A is a circuit diagram of a bias circuit 200 having a selectable array of capacitors. The circuit 200 includes a current source 220 that is selectively enabled by the "Enable" signal to generate, along with the diode connected PMOS device 222, a voltage at the bias voltage node Vbiasp. A plurality of outputs 210, enabled by the bias voltage node Vbiasp, generate output voltages at nodes Vout1, Vout2 and VoutN. The output voltages may be coupled to one or more nodes of a circuit (not shown) associated with the bias circuit 200. A control circuit 230, responsive to the "Enable" signal, selectively couples an array of capacitors to bias node Vbiasp.

The bias circuit 200 may be configured to operate in a manner comparable to the bias circuit 100 described above with reference to FIG. 1A, with the exception that the control circuit 230 selectively enables a plurality of capacitors to be coupled to the bias node Vbiasp. In one embodiment, the control circuit 230 may be configured to couple all capacitors to the array during power-on of the bias circuit 200. The values of the capacitors may be selected, in a manner as described above with reference to FIG. 1A, to achieve a proportional charge-sharing upon power-on of the bias circuit 200 to obtain a voltage at the bias node Vbiasp that is at or near the desired operating point. In alternative embodiments, during power-down, a first portion of the capacitors may be pulled to one rail (e.g., Vdd), while a second portion of the capacitors may be pulled to another rail (e.g., Vss). Under this approach, the first and second portions of capacitors (in addition to other capacitances inherent at the bias node Vbiasp) may be configured proportionately so as to obtain the desired operating point upon power-up.

In further embodiments, the control circuit 230 may enable only a selection of the capacitors to be coupled to the bias node Vbiasp during power-up. The particular selection of capacitors may be changed over time in response to one or more characteristics of the bias circuit 200, a power supply or temperature variation, or associated circuitry. An example control circuit is described below with reference to FIG. 2B.

Figure 2B:
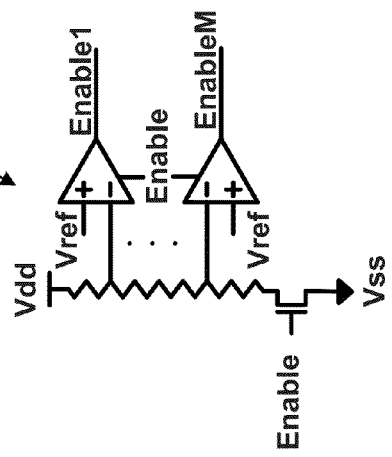
FIG. 2B is a circuit diagram of a control circuit for controlling a bias circuit.

FIG. 2B is a circuit diagram of a control circuit 201 for selecting the capacitors to be coupled to the bias node Vbiasp upon power-up of the bias circuit 200 of FIG. 2A. This control circuit 201 may compensate for variations in the supply voltage Vdd. As Vdd decreases, more capacitance may be needed to bring Vbiasp to the appropriate value upon power-up of the bias circuit 200. Accordingly, the control circuit 201 compares multiple inputs (relative to Vdd) against a reference voltage Vref. Based on this comparison, and in response to the "Enable" signal, the control circuit 201 outputs a plurality of enable signals "Enable1" . . . "EnableM" to enable a selection of the capacitors to be coupled to the bias node Vbiasp upon power-up of the bias circuit 200. In alternative embodiments, the control circuit 201 may be configured to output the enable signals based on other circuit characteristics, thereby compensating for factors such as temperature variations or differences in the implementation of the circuit 200 (i.e., process variations).

Figure 3:
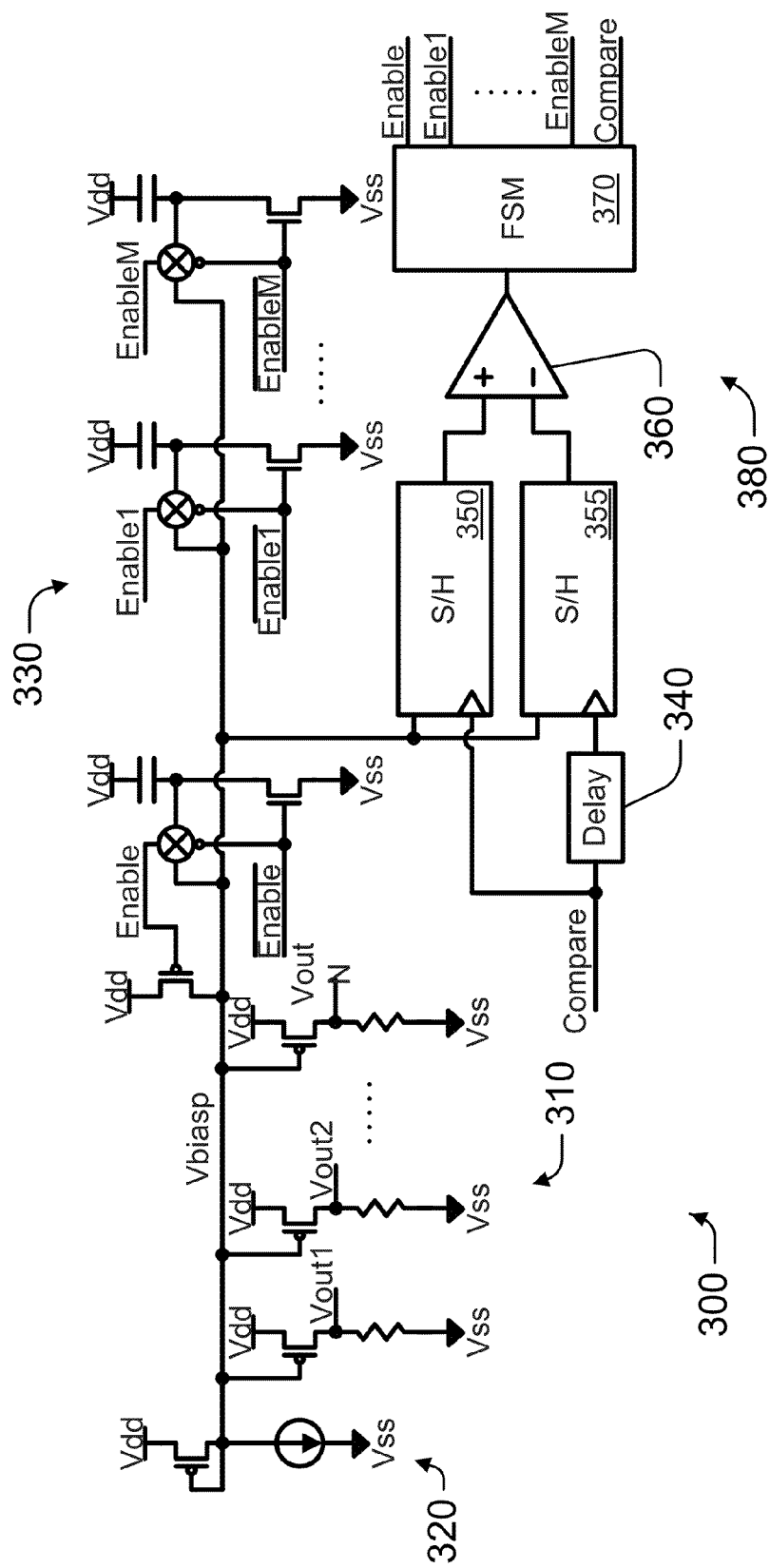
FIG. 3 is a circuit diagram of a bias circuit including calibration circuitry.

FIG. 3 is a circuit diagram of a bias circuit 300 including calibration circuitry. The circuit 300 includes a current source 320 that is selectively enabled by the "Enable" signal to generate, along with the diode connected PMOS device 222, a voltage at the bias voltage node Vbiasp. A plurality of outputs 310, enabled by the bias voltage node Vbiasp, generate output voltages at nodes Vout1, Vout2 and VoutN. The output voltages may be coupled to one or more nodes of a circuit (not shown) associated with the bias circuit 300. A control circuit 330, responsive to the "Enable" signal, selectively couples an array of capacitors to bias node Vbiasp.

The bias circuit 300 may be configured to operate in a manner comparable to the bias circuit 200 described above with reference to FIG. 2A, with the exception that a sampling control circuit 380 selectively enables a plurality of capacitors to be coupled to the bias node Vbiasp during power-up. The sampling control circuit 380 includes a delay 340, a pair of sample-and-hold (S/H) circuits 350, 355, a comparator 360, and a finite state machine (FSM) 370 to output the plurality of enable signals. The S/H circuits 350, 355, in response to a "compare" command, sample the voltage at the bias node Vbiasp at different times (as a result of the delay 340). For example, the voltage may be sampled immediately after the charge share operation, and then again at some later time to test if the initial voltage developed by charge sharing is higher or lower than the later value. There are several ways to delay the sample clock for S/H circuit 355 relative to S/H circuit 350. For example, instead of the Compare signal and delay 340, a state machine or other logic may generate two separate sampling clocks on different clock cycles. The comparator 360 compares these voltages, outputting the result (indicating a change in the bias voltage over a given time) to the FSM 370. The FSM 370 compares this measurement against a one or more references or a table of values, and determines which capacitors are to be coupled to the bias node Vbiasp upon startup to obtain the desired operating point voltage. This calibration may be conducted periodically or following a reset in order to maintain an accurate charge-share upon power-up of the bias circuit 300. Two example methods for calibrating the capacitors are described below with reference to FIGS. 4A and 4B.

Figure 4B:
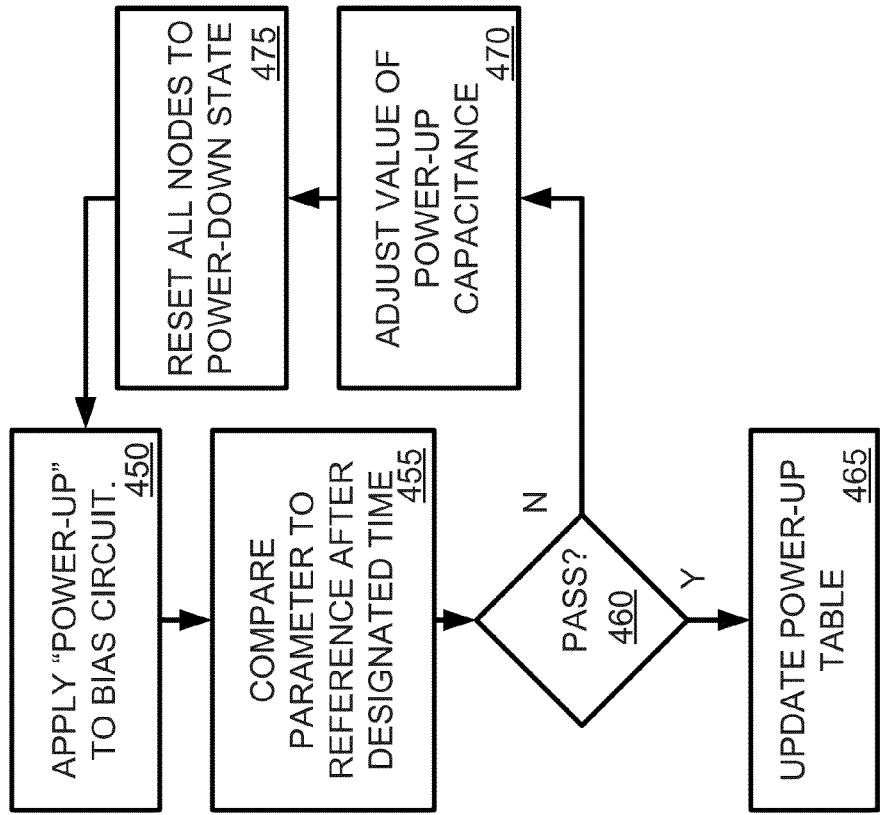
FIGS. 4A-B are flow diagrams of methods of calibrating a bias circuit.
Figure 4A:
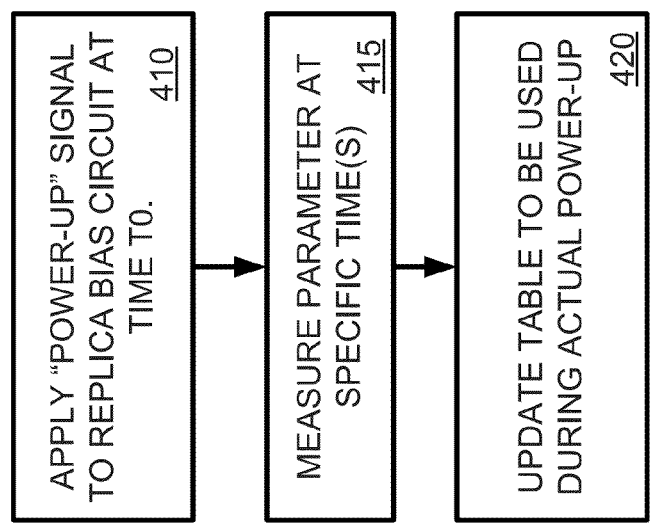

FIG. 4A is a flow diagram of a process for periodically calibrating a bias circuit such as the bias circuit 300 described above. The process employs a replica bias circuit for determining a selection of capacitors to be enabled during power-on of the bias circuit. A "power-up" signal is applied to the replica bias circuit to enable power-up toward the operating point (410). Parameters such as the voltage at the bias node are measured at one or more times following power-up of the replica bias circuit (415). If the parameters are acceptable (e.g., the voltage at the bias node is within a desired range of the operating point at a given time after power-up), then the configuration of the replica bias circuit (e.g., capacitors enabled) is recorded to a table or register for application to the bias circuit during actual power-up of the bias circuit (420).

FIG. 4B is a flow diagram of a process for recalibrating a bias circuit such as the bias circuit 300 described above. A power-up is initiated at the bias circuit (450). A parameter (e.g., voltage at the bias node) is compared against a reference at a designated time following power-up (455). If the parameter is acceptable (e.g., the voltage at the bias node is within a desired range of the operating point at a given time after power-up), then present configuration obtains a "pass" (460), and the configuration of the bias circuit (e.g., the selection of capacitors enabled) is recorded to a table or register for application to the bias circuit in future operation, including additional power-up processes (465). As applied to the bias circuit 300, for example, the accepted configuration may be stored at the FSM 370 to select the capacitors to be enabled during power-up.

If the configuration is not acceptable, then the value of the power-up capacitance is adjusted by enabling or disabling one or more capacitors (470). The bias circuit is then powered-down by resetting all nodes to a respective rail voltage (475). After a time sufficient for the selected capacitors to obtain a charge, the power-up (450) and comparison (455) processes are repeated to evaluate the bias circuit under the adjusted configuration. This process may be repeated until an acceptable configuration is detected.

Figure 5A:
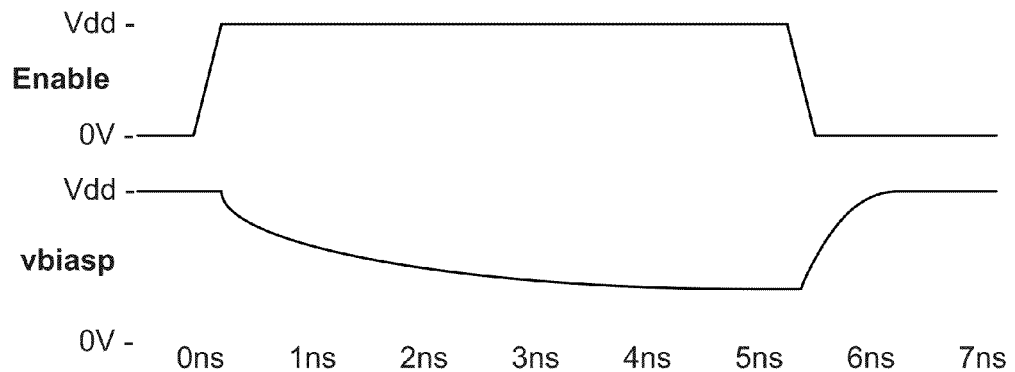
FIGS. 5A-B are timing diagrams illustrating startup of a bias circuit.
Figure 5B:
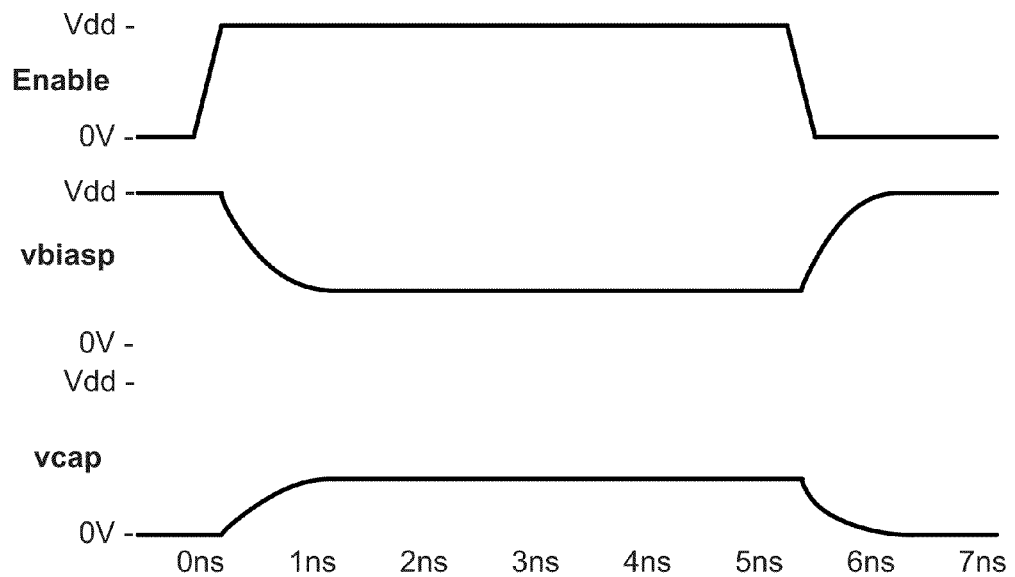

FIGS. 5A-B are timing diagrams illustrating startup of bias circuits. FIG. 5A depicts a power-on process of an example bias circuit that is absent a control circuit to induce a charge-share at the bias node. The node Vbiasp is pulled to the rail (Vdd) during power-down (Enable=0). During normal operation (Enable=1), Vbiasp moves to a voltage, dependent on process, supply voltage and temperature, in approximately 5 ns. As a result of this relatively long transition time, the operating current is maintained at a low level. The start-up time may be reduced by increasing the magnitude of the current source (resulting in continuous consumption of this current) or by temporarily increasing this current (induce greater ringing in the supply).

FIG. 5B depicts a power-on process of an example bias circuit that includes a control circuit and capacitor to induce a charge-share at the bias node, such as the bias circuits 100, 200, 300 described above. The bias circuit 101 may exhibit a similar response, but by switching inherent capacitance at the bias node Vbiasp rather than employing a discrete capacitor. Upon power-up, vbiasp may reach its operating point in under 1 ns, without a substantial increase in start-up current over the circuit of FIG. 5A.

FIG. 5B also illustrates the response of the bias circuit during power-down. Pulling nodes to the rails (e.g., Vdd, Vss) can be made faster (or slower) by changing the size of the enable devices.

FIG. 6A is a block diagram of a plurality of bias circuits 610, 620 configured to obtain power from a common rail (Vdd). Bias circuit 1 610 and bias circuit 2 620 are controlled by control circuits "enable1" and "enable2," respectively, to initiate power-up and power-down of the bias circuits.

FIG. 6B is a timing diagram depicting a staggered startup of the plurality of bias circuits 610, 620 in FIG. 6A. The power-up for the bias circuits 610, 620 is initiated at distinct times T0 and T1, respectively. As a result of this staggering, ringing at the common supply may be reduced, as described below with reference to FIGS. 7A-C.

Figure 7A:
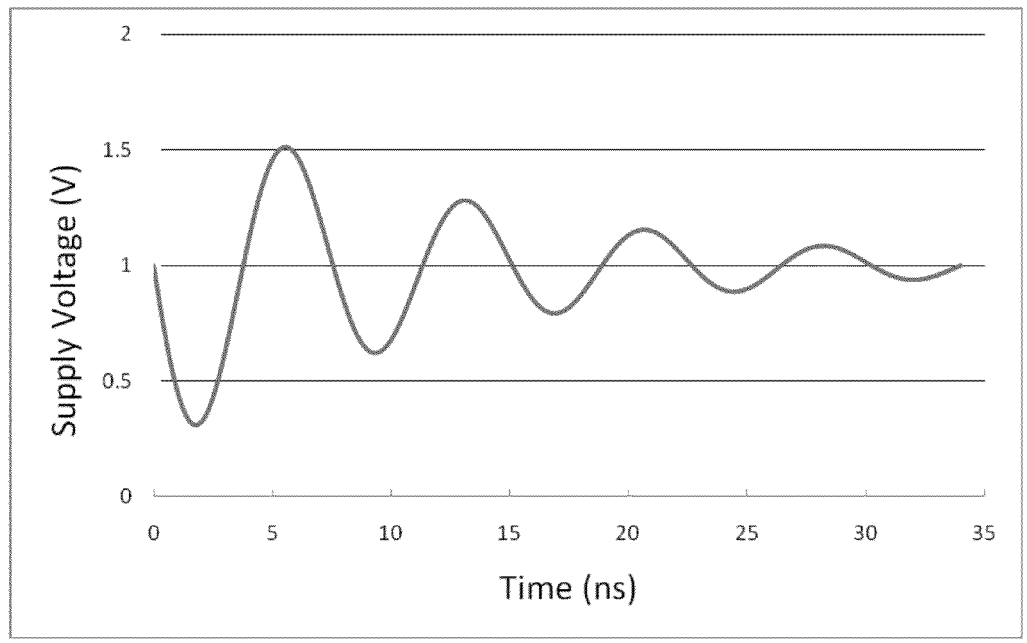
FIGS. 7A-C are timing diagrams illustrating ringing at a supply voltage.
Figure 7B:
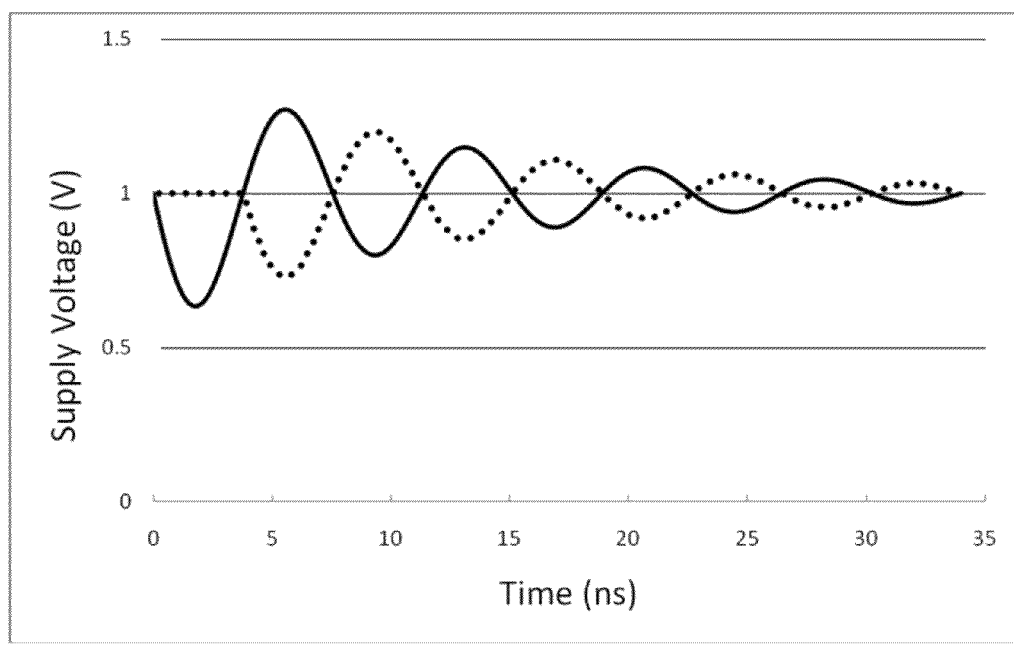
Figure 7C:
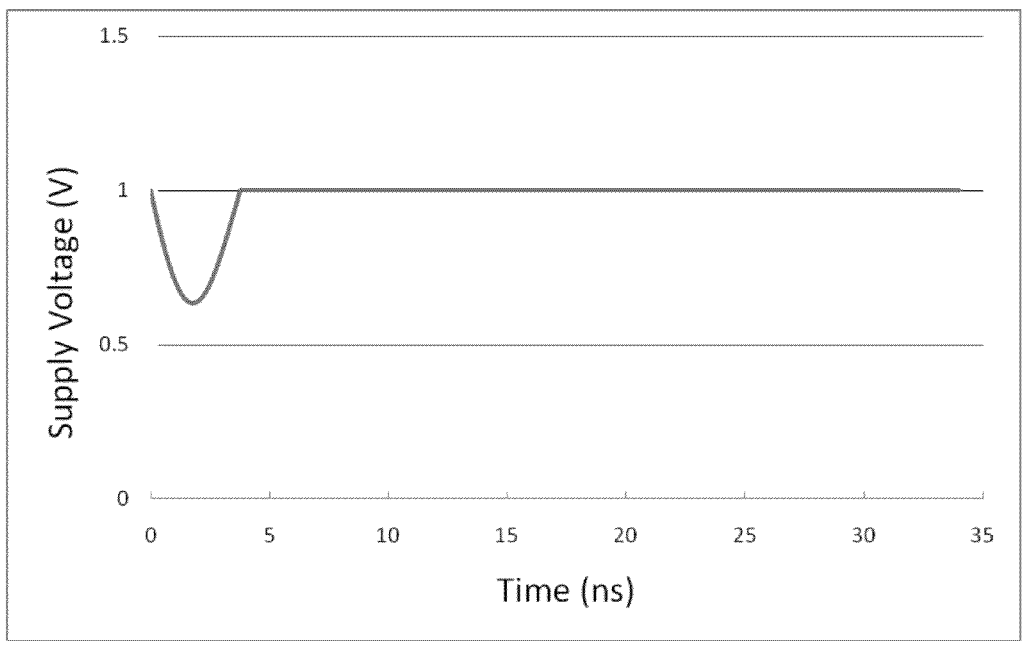

FIGS. 7A-C are timing diagrams illustrating ringing at a supply voltage associated with a plurality of bias circuits. FIG. 7A depicts a supply voltage ringing resulting from the startup of one or more bias circuits. FIG. 7B depicts two components of supply voltage ringing resulting from the startup of two bias circuits, where the startup of the bias circuits is staggered in time. FIG. 7C depicts a supply voltage ringing of FIG. 7B, showing the resulting waveform combining the ringing induced by the two bias circuits. Embodiments including more than two bias circuits may be configured to exhibit similar waveforms when the more than two bias circuits are enabled staggered in time.

Conventional bias circuits require current from a supply network to charge up the bias nodes. In such a bias circuit, a current surge across the power-up time (e.g., 5 ns) to charge up the capacitance of the bias node Vbiasp may induce a ringing event on the supply network. In contrast, the bias circuits 100, 101, 200, 300 described above require less current from the supply network to power-up the circuit because a substantial portion of the charge is obtained from the capacitor(s) (or charge-sharing of the intrinsic capacitance at the node). Thus, the charge from one capacitance is distributed to the bias node capacitance. The charge that decreases the original capacitor from Vdd to the operating point, and increases the added capacitor to the same operating point, is not derived from the supply network during power up. Because there is minimal change in the supply current, the power-up induces only minimal supply network ringing.

In some embodiments, the current surge to charge up the bias nodes may occur during power-down of the bias circuit. In this manner, the charge to power-up a circuit is pre-loaded onto the added (and/or intrinsic) capacitance such that, when the power-up is initiated, there is minimal current draw from the supply to move the bias node to the operating voltage. The delta current in going from zero to operating draw may induce some ringing, but this ringing will be less than that imposed by the combination of charge-up current and the operating current.

FIG. 7A depicts a typical supply ringing waveform due to a current surge of 100 mA at time zero. (A number of bias circuits may be enabled together, totaling 100 mA.) The frequency of oscillation is mainly a function of the inductance (external bypass capacitors, package and on-chip routing, for example) and capacitance (on-chip network and bypass). Note that the supply voltage is likely unsuitable for normal operation (and may even be cause permanent circuit degradation) well past 20 ns after the initial power-up signal.

By properly staggering the power-up current surges, the ringing can be mitigated. FIG. 7B shows the ringing due to two separate current events totaling 100 mA. (Some bias circuits may power-up at time 0 ns and the remainder may power-up at 3.78 ns.) The first is a 52.8 mA surge at time zero. The second is a 47.2 mA event at 3.78 ns. As shown in FIG. 7C, the resultant supply voltage is constant after the second draw, as the ringing due to the two events precisely cancels. Other phase/amplitude relationships can also have the same affect. For example, instead of dividing the 100 mA in two currents (timed 180 degrees out of phase), three currents at 120 degrees would have similar results. For the example of FIG. 7C, the second current surge may be controlled so as not to be delayed into the 7 ns realm, as the supply voltage peaks will align and exacerbate the problem. The optimal timing of current surges will be process, voltage, and temperature-dependent and may require iteratively determining when to power-up different blocks of bias circuits.

Because ringing is caused by a change (either increasing or decreasing) in current, powering-down of one or more bias circuits will also cause ringing. In the same way that staggering can reduce power up ringing, delaying some power down events may reduce power down ringing.

Figure 8:
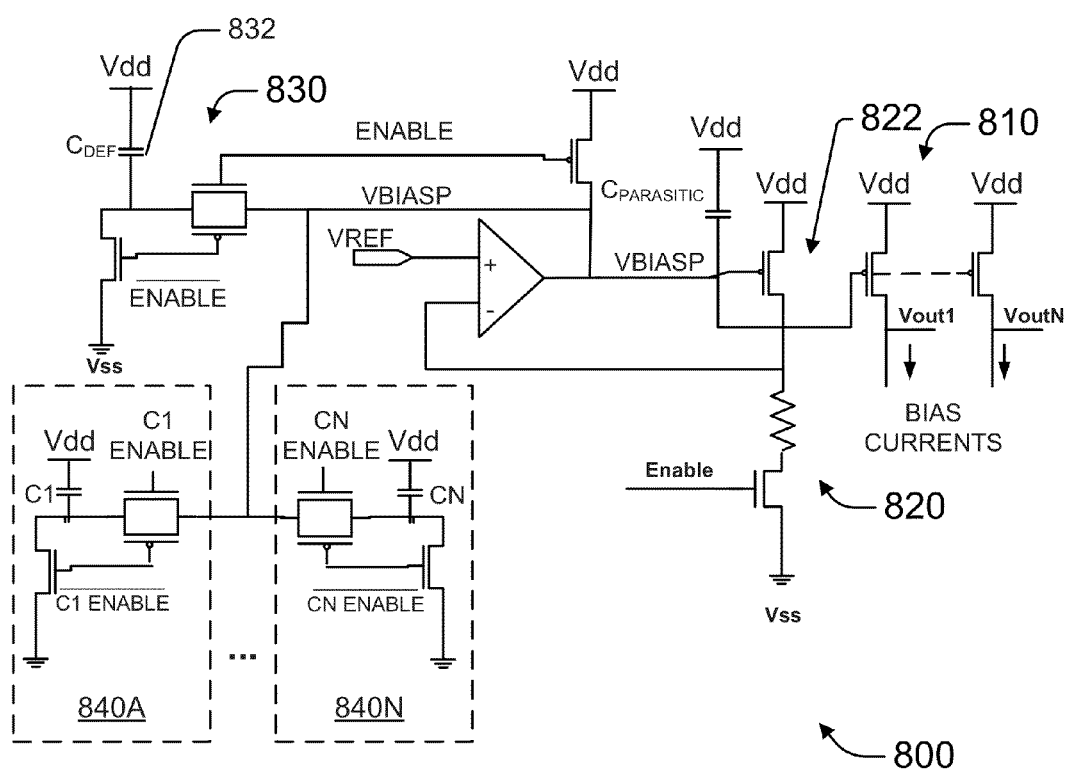
FIG. 8 is a circuit diagram of a bias circuit implementing a further embodiment.

FIG. 8 is a circuit diagram of a bias circuit 800 according to a further embodiment. The bias circuit 800 includes a current source 820 that is selectively enabled by the "Enable" signal to generate, along with a diode connected PMOS device 822, a voltage at the bias voltage node Vbiasp. In alternative embodiments, a reference source having one of a number of configurations, such as a circuit comprising an internal or external resistor, coupled to or absent of a transistor or diode, or another type of internal or external current source, may be implemented in place of the current source 820. A plurality of outputs 810, enabled by the bias voltage node Vbiasp, mirror a current at the current source 820. The output nodes Vout1 and VoutN may be coupled to one or more nodes of a circuit (not shown) associated with the bias circuit 800. A control circuit 830 selectively couples a capacitor 832 to the network.

Under normal operating conditions (Enable="1"), the bias node Vbiasp is at a voltage between the supply rails Vdd, Vss. During power down (Enable="0"), Vbiasp is pulled to Vdd, which in turn disables the outputs 810 (Vout1, VoutN). The current source 820 may also be turned off to complete a power down of the circuit. The "power on" time, being the time required for the node Vbiasp to transition from Vdd to the given operating voltage, is dependent upon the total capacitance at the node and the value of the current source 820 as well as the characteristics of the diode connected PMOS device 822. The "power on" time can be decreased by increasing operating power or reducing the total capacitance on the bias voltage node Vbiasp when the bias circuit 800 is initially powered on.

The control circuit 830 selectively couples the capacitor 832 to the network according to the "Enable" signal. In this manner, the capacitor 832 has zero volts on the lower terminal during power down, and, during power-up, is coupled to the bias node Vbiasp. Thus, upon startup, the charge on Vbiasp moves onto the capacitor 832, thus bringing the voltage at the bias node Vbiasp toward the operating point voltage. As a result, the operating voltage can be obtained quickly, with minimal impact upon normal operation, while simultaneously reducing a surge of supply current to the bias circuit 800.

In order to configure the control circuit 830 and capacitor 832 to achieve the operating voltage, the value of operating voltage for the bias node Vbiasp is first obtained. The total capacitance C for the node, including any residual capacitance exhibited by the circuit components, is obtained by measurement or estimation. The total capacitance C may then be divided into two domains in the power-down state: a first portion of C may be pulled to Vdd during power-down, while a second portion is pulled to Vss during power down. The domains are separated in the power-down state by the control circuit 830, which isolates them via a passgate structure. The domains may be configured to be proportional to the desired operating voltage, such that, when the domains are combined upon startup of the circuit 800 (the control circuit 830 enables the path at Vbiasp), a voltage approximating or matching the operating voltage appears at the bias node Vbiasp.

A "charge share" may be affected between the capacitor 832 and the total capacitance on the bias node Vbiasp, which includes $C_{PARASITIC}$ and the device capacitances opposite the control circuit 830. Given two identical capacitors, if the first capacitor is charged to 1.2V, the second is completely discharged (to 0V), and the two are shorted together via a switch, the resultant voltage will be 0.6V, or halfway between the two capacitors' initial voltages. The charge on the first capacitor is "shared" to the second and since they are identical, the initial charge gets split equally. If the first capacitor is twice as large as the second, then the resultant voltage will be ⅔ of the initial voltage or 0.8V. Similarly, if the second is three times as large as the first, the final voltage will be ¼ of the 1.2V or 0.3V. By adjusting the ratio of capacitance, one can obtain a desired non-rail voltage.

Thus, with respect to the capacitor 832, the capacitance value of the capacitor 832 may be selected based on the proportional capacitance to be achieved as described above. In particular, the capacitor 832 may be configured as a portion of the total capacitance C that is pulled to Vdd during power down. When the Enable signal is asserted to initiate power-up of the bias circuit 800, the two domains combine ("charge share") to produce the desired operating voltage at Vbiasp.

During power-down, all nodes are pulled to supplies and hence only consume current from device leakage, which may be quite low. Other supply voltages, if available, may also be employed to optimize start-up time, current surge reduction, silicon area or other design considerations. The additional circuitry can be implemented in parallel to the existing bias circuitry. It may be beneficial to add additional capacitance to the bias node Vbiasp to achieve the target proportion of capacitance at the two domains. For example, a circuit implementation may present obstacles to dividing a node between the two domains during power-down, necessitating the additional capacitance.

Further, the bias node Vbiasp may benefit from additional capacitance to increase noise immunity. By referencing both domains of the total capacitance C to either supply (Vdd, Vss), operational noise within the circuit 800 may be minimized. However, the circuit 800 may be configured to "charge share" at power-up as described above, and then disconnect some or all of the capacitance (e.g., capacitor 832) after a specified time or when the desired operating voltage is obtained.

For those cases where the desired operating point is a substantial portion of the supply, a single capacitor $C_{DEF}$ may be sufficient to obtain (or approximate) the operating point within an acceptable time. When the operating point requires greater accuracy, or is dependent on characteristics of the circuit, the capacitance at the node Vbiasp may be adjusted to cause the circuit 800 to reach the operating point more quickly and without substantial overshooting of the operating point.

To accomplish an accelerated startup time, the bias circuit may employ a programmable capacitance ratio, which may be adjusted automatically based on a comparison with a replica circuit, or may be adjusted periodically under settings maintained at a register. The values of the capacitors may be selected to achieve a proportional charge-sharing upon power-on of the bias circuit 800 to obtain a voltage at the bias node Vbiasp that is at or near the desired operating point. In alternative embodiments, during power-down, a first portion of the capacitors may be pulled to one rail (e.g., Vdd), while a second portion of the capacitors may be pulled to another rail (e.g., Vss). Under this approach, the first and second portions of capacitors (in addition to other capacitances inherent at the bias node Vbiasp) may be configured proportionately so as to obtain the desired operating point upon power-up.

In further embodiments, only a selection of the capacitors may be coupled to the bias node Vbiasp during power-up. The particular selection of capacitors may be changed over time in response to one or more characteristics of the bias circuit 800, a power supply or temperature variation, or associated circuitry. An example control circuit 900 is described below with reference to FIG. 9.

To provide such a programmable capacitance ratio, a selectable array of capacitor circuits 840A-N may be employed to switch in more or less capacitance to compensate, in real time, for a change from the initial conditions. (Although only two capacitor circuits 840A, 840N are shown, additional capacitor circuits may be implemented in accordance with a desired range of selectable capacitances.) Each capacitor circuit includes a gate that is controlled by a respective enable signal ($C1_{ENABLE}$ ... $CN_{ENABLE}$) to connect a respective capacitor (C1 ... CN) to the bias node Vbiasp. The enable signals may be provided by a control circuit such as the control circuit 900 described below with reference to FIG. 9, thereby enabling the capacitor circuits 840A-N in accordance with a feedback or other control configuration. For example, prior to a power-up sequence, the amount of capacitance (i.e., the capacitance selected among the capacitor circuits 840A-N) may be adjusted in response to observation of the turn-on voltage $V_{TP}$ relative to the supply voltage Vdd. Additionally, other measurements such as temperature or some other circuit or environmental condition and the desired bias voltage may be referenced to control the selected capacitance among the capacitor circuits 840A-N.

The bias circuit 300 described above with reference to FIG. 3 may be configured to operate in a manner comparable to the bias circuit 800 of FIG. 8, with the exception that a sampling control circuit 380 selectively enables a plurality of capacitors to be coupled to the bias node Vbiasp during power-up.

Figure 9:
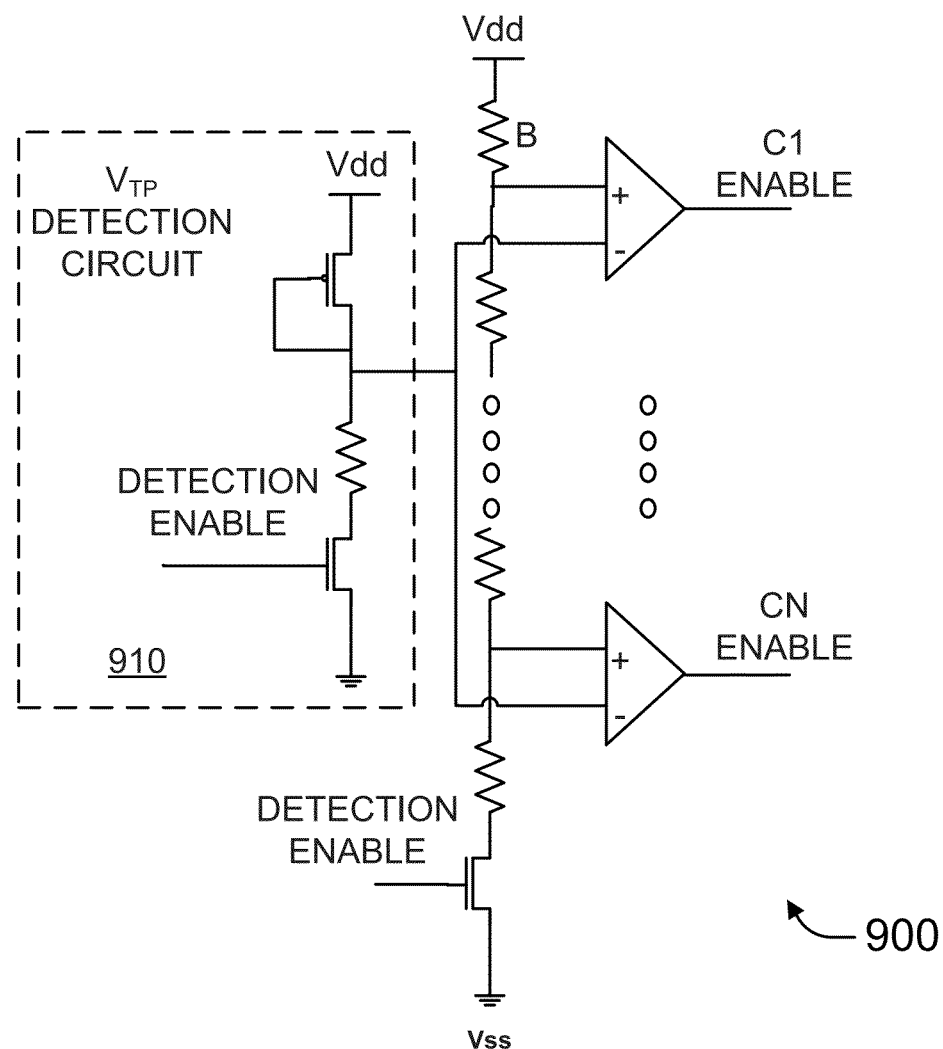
FIG. 9 is a circuit diagram of a control circuit for controlling a bias circuit.

FIG. 9 is a circuit diagram of a control circuit 900 for selecting the capacitors of the capacitor circuits 840A-N to be coupled to the bias node Vbiasp upon power-up of the bias circuit 800 of FIG. 8. This control circuit 900 may compensate for variations in the supply voltage Vdd. As Vdd decreases, more capacitance may be needed to bring Vbiasp to the appropriate value upon power-up of the bias circuit 800. Accordingly, the control circuit 900 includes a detection circuit 910, which detects the present turn-on voltage VTP (a voltage that sources the required current through a transistor) of the current source transistor of the bias circuit (e.g., PMOS device 822 in FIG. 8) by measuring the voltage at a replica circuit. The control circuit 900 then compares multiple inputs (relative to Vdd) against the output of the detection circuit 210. As a result, the turn-on voltage $V_{TP}$ is compared against the source voltage Vdd, and the result of this comparison is digitized in the selection of active enable signals. Based on this comparison, and in response to the "detection enable" signal, the control circuit 900 outputs a plurality of enable signals "$C1_{ENABLE}$" ... "$CN_{ENABLE}$" to enable a selection of the capacitors to be coupled to the bias node Vbiasp upon power-up of the bias circuit 800. In alternative embodiments, the control circuit 900 may be configured to output the enable signals based on other circuit characteristics, thereby compensating for factors such as temperature variations or differences in the implementation of the circuit 800 (i.e., process variations).

The following set of equations may be employed to determine the bias capacitance to be provided as a factor of the measured conditions of the bias circuit. The control circuit 900 of FIG. 9 and the capacitor circuits 840A-N of FIG. 8 may be configured to couple a capacitance to the bias node Vbiasp, based on a comparison of $V_{TP}$ and Vdd as described above, in accordance with the formula below:

$$C_{bias} = C_{parasitic} + C_{device}$$

$$C_{comp} = C_{def} + C_1 \ldots C_N$$

When charge sharing is enabled, total charge is shared.
During power down, $C_{bias}$ is set to Vdd and $C_{comp}$ is set to gnd(0)

$$(C_{comp} + C_{bias}) * V_{biasp} = (C_{bias} * Vdd) + (C_{comp} * Vss)$$

Since Vss=0

$$(C_{comp} * V_{biasp}) + (C_{bias} * V_{biasp}) = C_{bias} * Vdd$$

$$C_{comp} * V_{biasp} = (C_{bias} * Vdd) - (C_{bias} * V_{biasp})$$

$$C_{comp} * V_{biasp} = C_{bias} * (Vdd - V_{biasp})$$

$$C_{comp} = C_{bias} * \left(\frac{Vdd - V_{biasp}}{V_{biasp}}\right)$$

$$C_{comp} = C_{bias} * \left(\frac{Vdd}{V_{biasp}} - 1\right)$$

The control circuit 900 may be employed in the processes described above with reference to FIG. 4A to determine calibration values of a bias circuit. With reference to FIGS. 9 and 4A, a "power-up" signal is applied to the control circuit 900 to enable power-up toward the operating point (410). Parameters such as the outputs $C1_{ENABLE}$ ... $CN_{ENABLE}$ are measured at one or more times following power-up of the control circuit 900 (415). The configuration of the control circuit 900 (e.g., the enabled and disabled outputs) is recorded to a table or register for application to the bias circuit during actual power-up of the bias circuit (420).

Embodiments described above are not limited to bias circuits; rather, the aforementioned embodiments may be applied to the start-up of any internally generated voltage. For example, an on-chip regulator may be configured as described above to generate a given voltage. Furthermore, where embodiments shown use PMOS loads as current mirrors alternate embodiments could use NMOS or other transistor types as could be easily understood by those skilled in the art.

While this invention has been particularly shown and described with references to example embodiments thereof, it will be understood by those skilled in the art that various changes in form and details may be made therein without departing from the scope of the invention encompassed by the appended claims.

What is claimed is:

1. A method of operating a bias circuit providing a bias voltage at a bias node, comprising:
    connecting a bias node to a first voltage;
    charging a capacitor that is disconnected from the bias node to a second voltage different from the first voltage during a power-down mode of a bias circuit; and
    coupling the capacitor to the bias node, the capacitor charging the bias node toward a bias voltage as the bias circuit transitions from the power-down mode to a power-up mode;
    comparing a parameter of the bias circuit against a reference value; and
    adjusting capacitance of the capacitor based on the comparison.

2. The method of claim 1, wherein the capacitor includes a plurality of capacitive elements.

3. The method of claim 2, wherein coupling the capacitor to the bias node includes selectively coupling at least one of the plurality of capacitive elements to the first node.

4. The method of claim 3,
    wherein the parameter includes at least one voltage and the reference value includes a reference voltage, the at least one voltage being relative to a voltage of a power supply voltage coupled to the bias circuit; and further comprising:
    selectively coupling the at least one of the plurality of capacitive elements based on the comparison.

5. The method of claim 1, wherein the parameter is a voltage at the bias node at a given time following the power-up of the bias circuit.

6. The method of claim 1, wherein adjusting the capacitance includes selecting at least one of a plurality of capacitive elements.

7. The method of claim 1, wherein adjusting the capacitance includes updating a programmable array of capacitive elements.

8. The method of claim 1, wherein the capacitor includes a plurality of capacitive elements.

9. The method of claim 2, wherein coupling the capacitor to the bias node includes selectively coupling at least one of the plurality of capacitive elements to the first node.

10. A bias circuit to provide a bias voltage, comprising:
a bias node;
a first switch configured to connect the bias node to a first voltage during a power-down mode;
a capacitor;
a second switch configured to connect the capacitor to a second voltage during the power-down mode;
a third switch configured to couple the capacitor to the bias node during power-up of the bias circuit, the capacitor drawing the voltage of the bias node toward a bias voltage; and
a comparator configured to compare a parameter of the bias circuit against a reference value, the capacitor having a capacitance based on the comparison.

11. The apparatus of claim 10, wherein the capacitor includes a plurality of capacitive elements.

12. The apparatus of claim 11, wherein the third switch is configured to selectively couple at least one of the plurality of capacitive elements to the first node.

13. The apparatus of claim 12,
wherein the at least one comparator is configured to compare at least one voltage against a reference voltage, the at least one voltage being relative to a voltage of a power supply voltage coupled to the circuit; and
wherein the third switch selectively couples the at least one of the plurality of capacitive elements based on the comparison.

14. The apparatus of claim 10, wherein the parameter is a voltage at the bias node at a given time following the power-up of the circuit.

15. The apparatus of claim 10, wherein the capacitance corresponds to a selection of at least one of a plurality of capacitive elements.

16. The apparatus of claim 10, wherein the capacitance corresponds to a configuration of a programmable array of capacitive elements.

17. The apparatus of claim 10, wherein capacitance of the capacitor is selected to minimize start-up time of the bias circuit following power-up.

18. The apparatus of claim 10, wherein the capacitor in a charged state has a voltage equivalent to the bias voltage.

19. A method of operating a bias circuit providing a bias voltage at a bias node, comprising:
connecting a bias node to a first voltage;
charging a capacitor that is disconnected from the bias node to a second voltage different from the first voltage during a power-down mode of a bias circuit; and
coupling the capacitor to the bias node, the capacitor charging the bias node toward a bias voltage as the bias circuit transitions from the power-down mode to a power-up mode;
wherein the bias circuit is a first bias circuit, and further comprising:
powering-up a second bias circuit at a time T following power-up of the first bias circuit, the time T selected to minimize ringing at a power supply common to the first and second bias circuits.

20. A method of operating a bias circuit providing a bias voltage at a bias node, comprising:
connecting a bias node to a first voltage;
comparing a detected voltage against a reference voltage, the detected voltage being relative to a voltage of the bias node;
selecting a capacitance value of a capacitor based on the comparison, the capacitor being disconnected from the bias node;
charging the capacitor to a second voltage different from the first voltage during a power-down mode of a bias circuit; and
coupling the capacitor to the bias node, the capacitor charging the bias node toward a bias voltage as the bias circuit transitions from the power-down mode to a power-up mode.

21. The method of claim 20, wherein the capacitor includes a plurality of capacitive elements.

22. The method of claim 21, wherein selecting the capacitance value includes selecting a subset of the plurality of capacitive elements.

23. The method of claim 20, wherein the detected voltage corresponds to a turn-on voltage of a transistor connected to the bias node.

24. The method of claim 23, wherein comparing the detected voltage includes enabling a replica circuit to generate the detected voltage.

25. The method of claim 20, wherein the reference voltage corresponds to a voltage of a power supply coupled to the bias circuit.

26. The method of claim 20, wherein the detected voltage is detected prior to the power-up of the bias circuit.

27. The method of claim 20, wherein selecting the capacitance includes updating a programmable array of capacitive elements.

28. The method of claim 20, wherein the capacitance value is selected to reduce ringing at a voltage source and minimize start-up time of the bias circuit following power-up.

29. The method of claim 20, wherein charging the capacitor includes charging the capacitor to a voltage equivalent to the bias voltage.

* * * * *